(12) United States Patent
Whitehead (10) Patent No.: US 12,505,933 B2
(45) Date of Patent: Dec. 23, 2025

(54) ELECTRICAL GENERATOR SYSTEM INCLUDING RADIONUCLIDE MATERIAL AND INTRINSIC N-TYPE SEMICONDUCTOR MATERIAL

(71) Applicant: INFINITE POWER COMPANY PTY LTD, Bowen Hills (AU)

(72) Inventor: Steven Christopher Whitehead, Cumbria (GB)

(73) Assignee: INFINITE POWER COMPANY PTY LTD, Bowen Hills (AU)

(*) Notice: Subject to any disclaimer, the term of this patent is extended or adjusted under 35 U.S.C. 154(b) by 4 days.

(21) Appl. No.: 18/720,632

(22) PCT Filed: Dec. 15, 2022

(86) PCT No.: PCT/AU2022/051512
§ 371 (c)(1),
(2) Date: Jun. 15, 2024

(87) PCT Pub. No.: WO2023/108220
PCT Pub. Date: Jun. 22, 2023

(65) Prior Publication Data
US 2025/0054650 A1 Feb. 13, 2025

(51) Int. Cl.
*G21H 1/06* (2006.01)
(52) U.S. Cl.
CPC ................... *G21H 1/06* (2013.01)
(58) Field of Classification Search
CPC .............. G21H 1/00; G21H 1/04; G21H 1/06
USPC ......................... 310/301, 302, 303
See application file for complete search history.

(56) References Cited

U.S. PATENT DOCUMENTS

| 8,487,507 | B1 | 7/2013 | Cabauy et al. |
| 2017/0309359 | A1 | 10/2017 | Whitehead |
| 2023/0091756 | A1* | 3/2023 | Cabauy .................... G21H 1/06 310/303 |

FOREIGN PATENT DOCUMENTS

CN 106847361 A * 6/2017 ............... G21H 1/04

OTHER PUBLICATIONS

Li et al., Machine Translation of CN 106847361, Jun. 2017 (Year: 2017).*
IP Australia, Notice of Acceptance for your patent application for Australian Patent Application No. 2022408205, mail date Mar. 21, 2025.

(Continued)

*Primary Examiner* — Eric Johnson
(74) *Attorney, Agent, or Firm* — SoCal IP Law Group LLP; Jonathan Pearce (57) ABSTRACT

An electrical generator system including a radionuclide material; and a sandwich structure, the sandwich structure including: a layer of an n-type semiconductor material; a layer of intrinsic n-type semiconductor material; a layer of p-type semiconductor material; and metal electrodes, one of the electrodes being in direct contact with said n-type semiconductor material and another electrode being in contact with the p-type semiconductor material, forming metal-semiconductor junctions therebetween; wherein radiation emissions received from said radionuclide material are converted into electrical energy at said metal-semiconductor junctions; and electrical contacts connected to said electrodes which facilitate the flow of said electrical energy when connected to a load.

18 Claims, 9 Drawing Sheets (56) References Cited

OTHER PUBLICATIONS

Li, XY., Lu, JB., Liu, YM et al. Exploratory study of betavoltaic battery using ZnO as the energy converting material. Nucl Sci Tech 30, 60 (2019).
Australia Patent Office/ISA, International Search Report and Written Opinion for PCT Application No. PCT/AU2022/051512, mail date Mar. 17, 2023.

* cited by examiner

ELECTRICAL GENERATOR SYSTEM INCLUDING RADIONUCLIDE MATERIAL AND INTRINSIC N-TYPE SEMICONDUCTOR MATERIAL

RELATED APPLICATION INFORMATION

This patent claims priority from International PCT Patent Application No. PCT/AU2022/051512, filed Dec. 15, 2022, entitled, "ELECTRICAL GENERATOR SYSTEM", which claims priority to Great Britain Patent Application No. 2118322.3, filed Dec. 16, 2021, all of which are incorporated herein by reference in their entirety.

TECHNICAL FIELD

The present invention relates to the field of electrical generation, and in particular, to electrical energy generated from the energy from radioactive emissions. Practical applications of the invention can be found in forming power cell devices and other applications.

BACKGROUND OF THE INVENTION

Power cells provide a self-contained source of electrical energy for driving an external load. A common example of an electrical power cell is an electrochemical battery. While electrochemical batteries are effective at providing power needs for a period of time at a relatively low cost, the limiting factor is the available energy defined by the material type and weight. Due to the limited energy storage and energy density of electrochemical batteries with regard to their mass, there have been various attempts at producing alternative power cells, such as batteries powered by radioactive isotopes due to the higher theoretical limits of energy density.

There are several different types of radioisotope-powered batteries. Once such type is a radiothermal generator (RTG) which uses the heat produced during decay of radioactive material to produce electrical energy. These devices have low conversion efficiency of the heat energy to electrical energy. Accordingly, RTGs are generally used with very high energy radioisotopes, such as Pu-238, to produce a source of electrical power and usually require substantial shielding. In addition, the electrical power output is low.

Another type of radioisotope-powered power cell is an indirect conversion device which uses a radioisotope, luminescent material and a photovoltaic cell. The decay particles emitted by the radioisotope excite the luminescent material. The light emitted by the luminescent material is absorbed by the photovoltaic cells to generate electricity. This type of battery generally has low efficiency because of the two-step conversion, and a relatively short lifespan because the luminescent material suffers radiation damage by the emissions.

Another example of a radioisotope powered power cell is a direct conversion device which uses a radioisotope and semiconducting material. Conventional semiconductors are of only limited use, in this application, as they suffer collateral radiation damage from the radioisotope decay products. In particular, incident high-energy beta particles create defects in the semiconductor that scatter and trap the generated charge carriers. The damage accumulates and thereby over time reduces the performance of the battery.

U.S. Pat. No. 5,260,621 discloses a solid state nuclear battery comprising a relatively high energy radiation source, with concomitant heat generation, and a bulk crystalline semiconductor such as AlGaAs, which is characterised by defect generation in response to the radioisotope. The material is chosen so that radiation damage is repaired by annealing at the elevated operating temperature of the battery. This device suffers from low efficiency, which necessitates the use of a high energy radiation source and also requires elevated operating temperatures to function.

U.S. Pat. No. 5,859,484 teaches a solid state radioisotope-powered semiconductor battery comprising a substrate of crystalline semiconductor material such as GaInAsP. This battery preferably uses a radioisotope that emits only low energy particles to minimise degradation of the semiconductor material in order to maximise lifetime. The effect of using a lower energy source material is a lower maximum power output.

A further such device is disclosed in U.S. Pat. No. 6,479,919, which describes a beta cell incorporating icosahedral boride compounds, a beta radiation source and a means for transmitting electrical energy to an outside load. Manufacturing boron arsenide and boron phosphide is expensive which increases the cost of producing these types of devices. Further, the production of such devices has increased health, safety and environmental risks associated with handling the arsenide and phosphide materials.

WO2016074044 by Kinetic Energy Australia Pty Ltd discloses a radioisotope generator using ZnO as a semiconductor, with energy generated at a metal-semiconductor junction. This allows for good durability and relatively high power production. However, the arrangement disclosed, while particularly effective for radioisotope sources which primarily emit beta particles, is less effective for x-ray and gamma ray emitters.

It is an object of the present invention to provide a radioisotope power cell which exhibits an improved balance between durability and power output, particularly for radiation sources which emit x-rays and gamma rays.

SUMMARY OF THE INVENTION

In a broad form, the present invention provides an electrical generator having a multi-layer structure including a radionuclide material, an n-type semiconductor layer, an intrinsic n-type material, a p-type material layer and metal electrodes.

According to one aspect, the present invention provides an electrical generator system including:
  a radionuclide material; and a sandwich structure, the sandwich structure including:
  a layer of an n-type semiconductor material;
  a layer of intrinsic n-type semiconductor material;
  a layer of p-type semiconductor material; and
  metal electrodes, one of the electrodes being in direct contact with said n-type semiconductor material and another electrode being in contact with the p-type semiconductor material, forming metal-semiconductor junctions therebetween; wherein radiation emissions received from said radionuclide material are converted into electrical energy at said metal-semiconductor junctions; and
  electrical contacts connected to said electrodes which facilitate the flow of said electrical energy when connected to a load.

In preferred forms, the generator includes multiple sets of layers, so as to increase the effective capture of the energy of the radionuclide. In a preferred form, the dominant radiation from the radionuclide is in the form of x-ray and/or gamma ray emissions.

In suitable implementations, the present invention allows for the effective generation of energy from suitable x-ray and/or gamma ray emitting radioisotopes, as well as providing a structure which is able to continue effective operation for long periods despite the constant irradiation inherent in such devices.

BRIEF DESCRIPTION OF THE DRAWINGS

Illustrative embodiments of the present invention will now be described with reference to the accompanying drawings, in which.

DETAILED DESCRIPTION OF THE INVENTION

The present invention will be principally described with reference to particular illustrative examples. It will be understood that the principles of the present invention may be implemented using variations of features on the particular implementations illustrated and described. The nature of the present invention is such that there are many possible implementations which can be envisaged using the principles of the present invention, for example numbers of layers, additional layers, alternative radioisotopes (or combinations thereof), and so forth.

The present invention uses some principles in common with the invention described in WO2016074044, by the present inventor. The disclosure of that application is hereby incorporated by reference. In particular, that application teaches the importance and advantages of the use of ZnO as an intrinsic n-type semi-conductor material.

However, the present invention is particularly (although not to the exclusion of other radioisotopes) primarily concerned with the generation of electrical energy using radioisotopes which generate x-rays and gamma rays.

The mechanism, or mode of action of beta-particles when impinging our semiconductor materials is very different to that for x-ray and gamma photons. All things being equal, beta collisions at typical energies have much more impact on the atomic structure than do x-ray and gamma photons. Beta particles will typically dislodge electrons and atoms and excite electrons, whereas x-ray and gamma photons are unlikely to dislodge atoms but may dislodge electrons and will excite electrons.

The inventors have observed that the gamma-voltaic structure functions, in some respects, in a generally similar way to a standard photovoltaic material. However, the energy of individual photons is dramatically shifted from a few eV with infra-red, visible light, or ultra-violet light, up to keV and MeV with x-ray and gamma photons. Under such conditions, a typical photovoltaic semiconductor structure will decline in performance and fail relatively rapidly due to radiation induced damage.

Because the interactions of the x-ray and gamma photons are lower relative to beta particles, or in other words the radiation cross section is smaller, implementations of the present invention seek to increase the energy captured by adding the p-type material to the structure. It has also been observed by the inventors that multiple layers of such sandwich structures are particularly advantageous.

Zinc Oxide is an intrinsic n-type semiconductor—in equilibrium the material exhibits n-type semiconductor properties. Aluminium Zinc Oxide (AlZnO) is an n-type semiconductor—similar to Zinc Oxide, however, the aluminium increases the n-type properties of the semiconductor. Aluminium is added as a dopant, preferable in the range of about 0.5% to about 10%. The ZnO layer thickness must be adjusted in response to the level of dopant within the AlZnO, as is explained further below.

It is preferred to have a layer of intrinsic ZnO in between the n-type and p-type materials for several reasons. It provides an adjustable built in voltage (Vb) for the structure. It also acts as a barrier to prevent migration of dopant materials from the n-type to the p-type and vice versa. If such migration occurs, it will interfere with the desired solid state structures, and degrade the performance of the structure.

Figure 1:
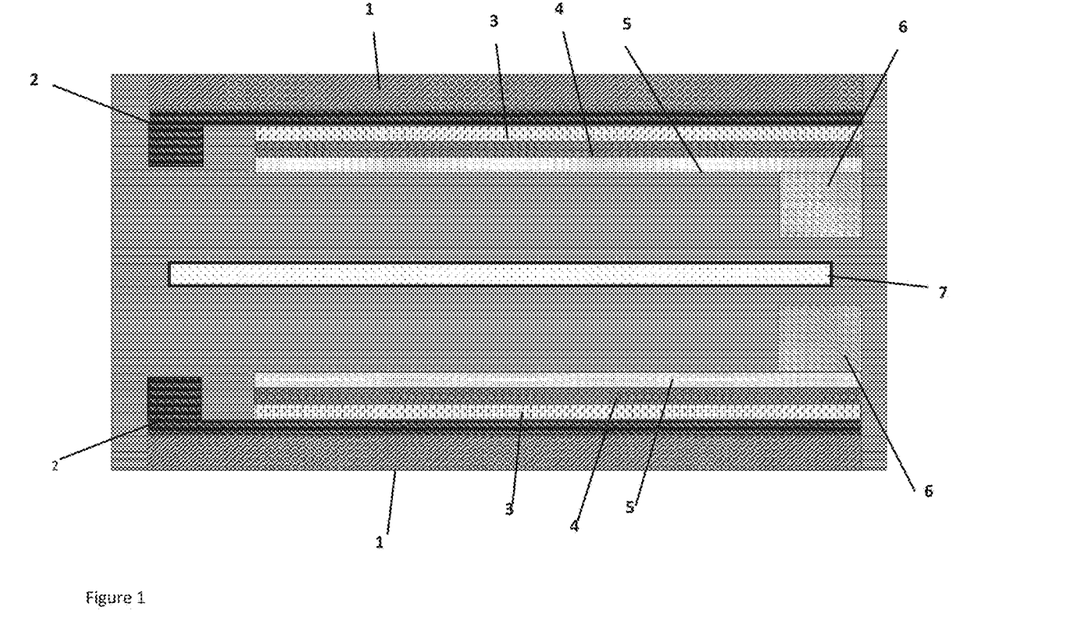
FIG. 1 is a cross sectional view of an implementation of a single power generating structure according to the present invention.

FIG. 1 illustrates a power generating structure according to an embodiment of the present invention. A radioisotope material 7 is disposed centrally. To either side, layers are disposed in order to receive the radiation, preferably gamma an/or x-ray, from the radioisotope. In this implementation, these are a top contact 6. n-type layer 5, intrinsic n-type layer 4, p-type layer 3, bottom contact 2 and a non-conductive substrate 1. The balance of the structure is formed from suitable framework materials to locate the substrates and the radioisotope. The structural framework materials can be split into 'structurally integral' being typically of steel or aluminium sheet, angle bar, rod or tube; and 'racking system' being of non-conductive materials, either ceramic or polymeric, examples include Macor, or polystyrene.

The top and bottom contacts are formed from a metal, for example copper, aluminium, copper-aluminium alloy, copper-iron-aluminium alloy, gold, silver, nickel, cobalt, tin or nickel-vanadium alloy.

The n-type layer may be formed from any suitable material, preferably aluminium zinc oxide. The Al may be up to 10%, although it is preferably at an atomic ratio of about 98 Zn to 2 Al.

The intrinsic n-type material is preferably ZnO.

A wide variety of materials are possible as p-type materials, for example Nickel Vanadium Oxide (93-7 Ni—V), Nickel Oxide, Nickel Cobalt Oxide (98-2 Ni—Co) Cobalt Oxide, Cobalt Copper Oxide (98-2 Co—Cu), Nickel Copper Oxide (98-2 Ni—Cu), Copper Oxide, Cobalt Nickel Oxide (98-2 Co—Ni), Nickel Chromium Oxide (90-10 Ni—Cr), Nickel Platinum Oxide (98-2 Ni—Pt), Copper Chromium Oxide (99-1 Cu—Cr), Cobalt Platinum Oxide (98-2 Co—Pt), Cobalt Titanium Oxide (96-4 Co—Ti). For the avoidance of misunderstanding, all these ratios are expressed as numbers of atoms out of 100, not as weight percentages. While in principle other salts with alternative anions could be used, for example nitrides, it is preferred that materials are selected so that the breakdown products are not hazardous or destructive to the structure. Given the intended radiation environment, a small level of conversion of anions to their parent elements is to be expected. Chlorides for example are not recommended, and oxides are preferred.

The substrate may be formed from any suitable radiation hard material, for example Silicon, Quartz, Sapphire, Float Glass, Schott Borofloat glass, Phosphate glass, Calcium Fluoride.

The radioisotope material may be a single isotope, a mixture of isotopes, or even a mixture of radioactive material and stable material. A single element is preferred, as this simplifies eventual disposal and waste management. Possible isotopes for use in embodiments of the present invention include Caesium-137, Cobalt-60, Europium-152, Gadolinium-153, Germanium, Iridium-192, Iron-55, Krypton-85, Ruthenium-106, Selenium-75, Sodium-22, Strontium-90, Ytterbium-169. These isotopes may be deliberately produced for use in embodiments of the present invention, or may be by-products or waste material from other processes. It will be understood that over time, as radioactive decay occurs, the material will come to have a mixture of different isotopes as a result of the decay process, and so additional modes of isotopic decay of those isotopes may also be present within the material.

The present invention could also be deployed to generate power from 'waste' x-rays or gamma rays from other processes. In that case, the x-ray or gamma source would likely be disposed at one side rather than centrally.

The thicknesses of each layer will vary depending on the specific materials selected, and the geometry for the overall system. Typical thicknesses are as follows:

Substrate 0.25 mm to 10 mm.
Bottom metal contact 0.2 to 5 µm.
P-type layer 0.2-5 µm
Intrinsic layer 0.2-2 µm
N-type layer 0.2-5 µm
Top metal contact 0.2 to 5 µm It has been determined by the inventor that, in general, increasing the proportion of dopant in the n-type layer results in a need to increase the intrinsic ZnO layer thickness, equally, decreasing the dopant results in a need to reduce the ZnO layer thickness. This also applies to the p-type material. The appropriate thickness of the different layers is material specific and the inter-relation of the dopant and layer material is an important variable. It will be appreciated that appropriate trials for selected layers in any design will be required in order to determine the optimal thicknesses for each layer, depending upon the materials selected. Preparation of the layers is preferably via magnetron sputtering—DC and/or RF.

Figure 2:
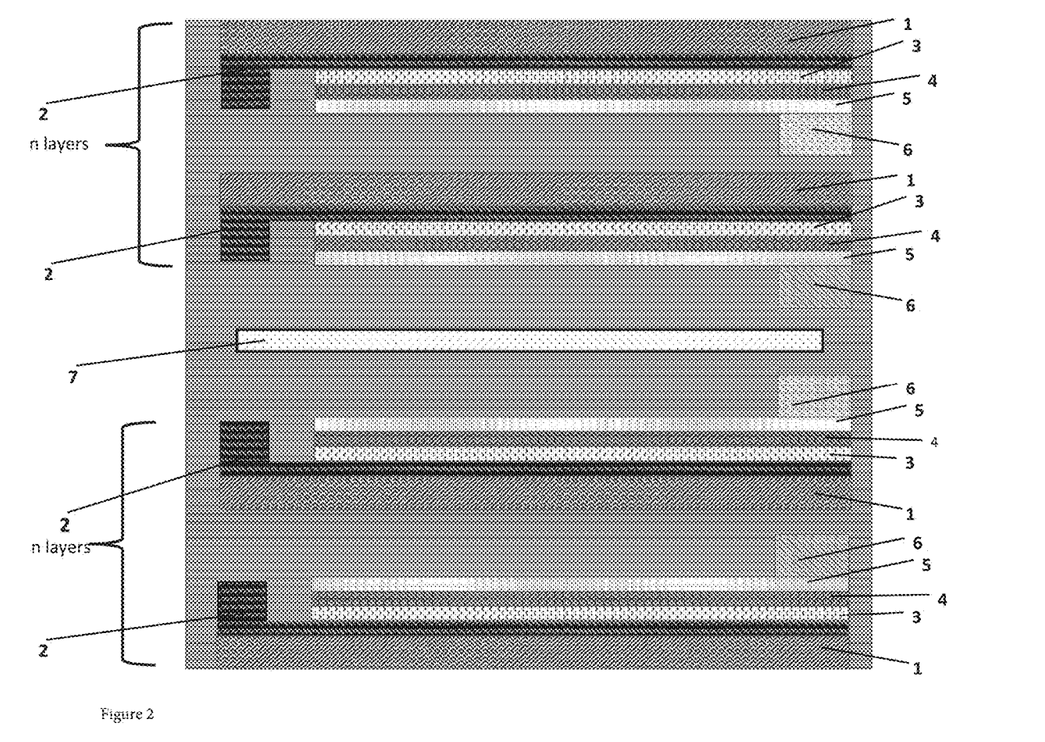
FIG. 2 is a cross sectional view of an implementation of a multi-layer power generating structure according to the present invention.

FIG. 2 illustrates how the structures may be expanded to provide multiple layers for possible interaction with the gamma and x-ray photons. In both directions away from the radioisotope, n layers of material may be disposed. It will be understood that additional layers present additional opportunities for generating power from the same radiation source. In effect, the radiation cross section of the structure is increased.

Figure 6:
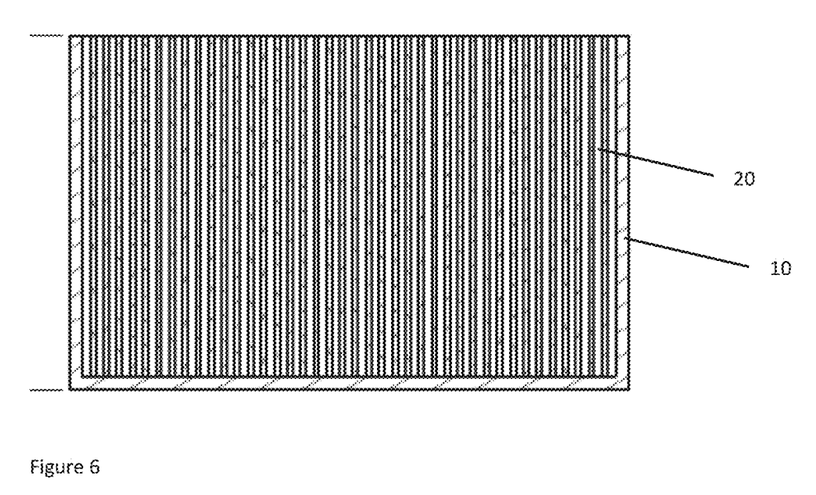
FIG. 6 is cross-sectional view of a single set of gamma generating structures.
Figure 7:
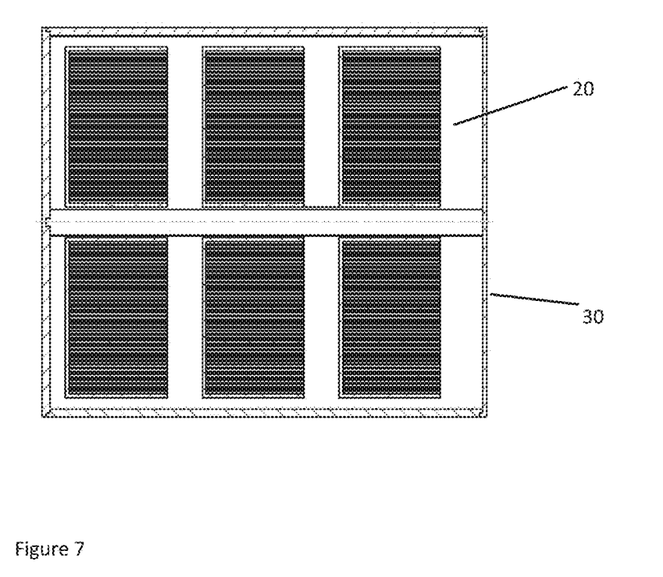
FIG. 7 is a cross-sectional view of an array of sets according to FIG. 5.

FIG. 6 illustrates a cartridge 20 with 50 layers of power generating structures 10, for use as a component of a larger system. In this structure, there is a series of structures, as in FIG. 2, but excluding the radioisotope layer 7. Instead of 4 repeats of the layers, as shown in FIG. 2, in this alternative implementation there are 50 repeats of the sequence of layers.

FIGS. 7 to 10 illustrates a generating structure 30 in which 12 units of the cartridge 20 of FIG. 6 are arranged in two layers of 6 units, with the radioisotope inserted as sealed sources into three openings 32, 32A, 32B.

Figure 8:
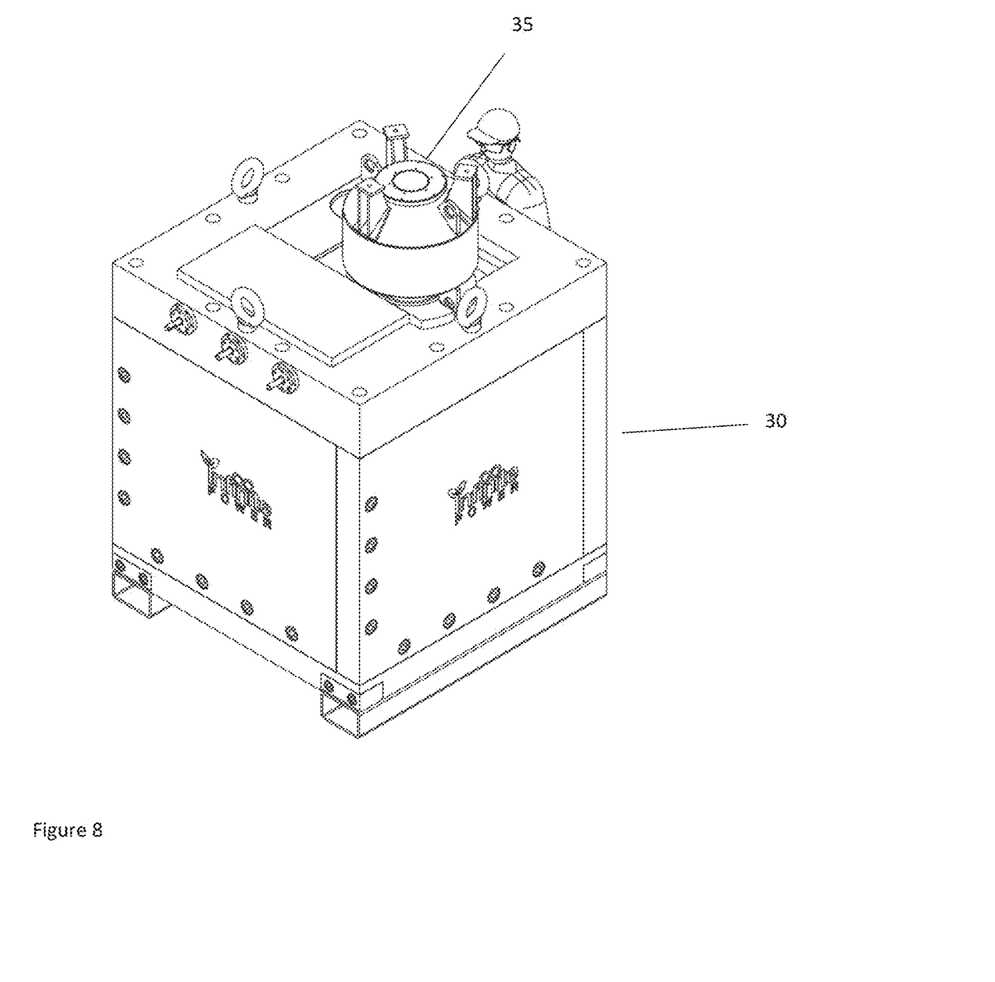
FIG. 8 is an external view of an embodiment of the practical system.

FIG. 8 is an exterior view of generating structure 30. The isotope loader container 35 at the top allows for secure and safe loading of radioactive sources into the generating structure 30. The loader may be moved to the appropriate position to load a core into each opening. This can be seen more clearly in FIGS. 9 and 10. The isotope loader container 35 is used to safely and easily transfer isotope cores from the transport container into the power unit. Once the isotope is loaded, the structure of the power cell unit is sealed, and the loader structure is removed, and so is available for use with loading another unit.

Figure 9:
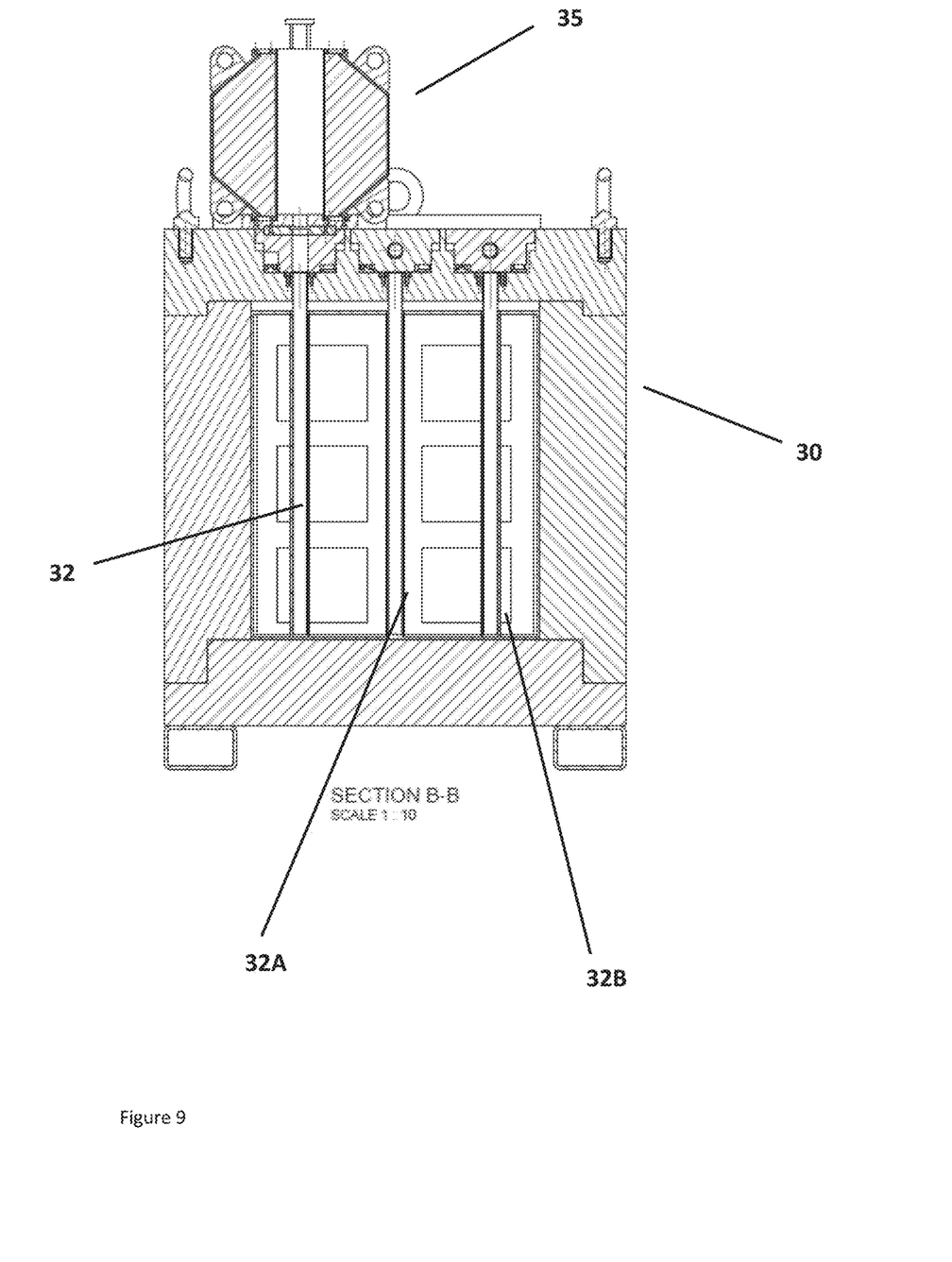
FIGS. 9 and 10 are cross sectional views relative to the design of FIG. 7.
Figure 10:
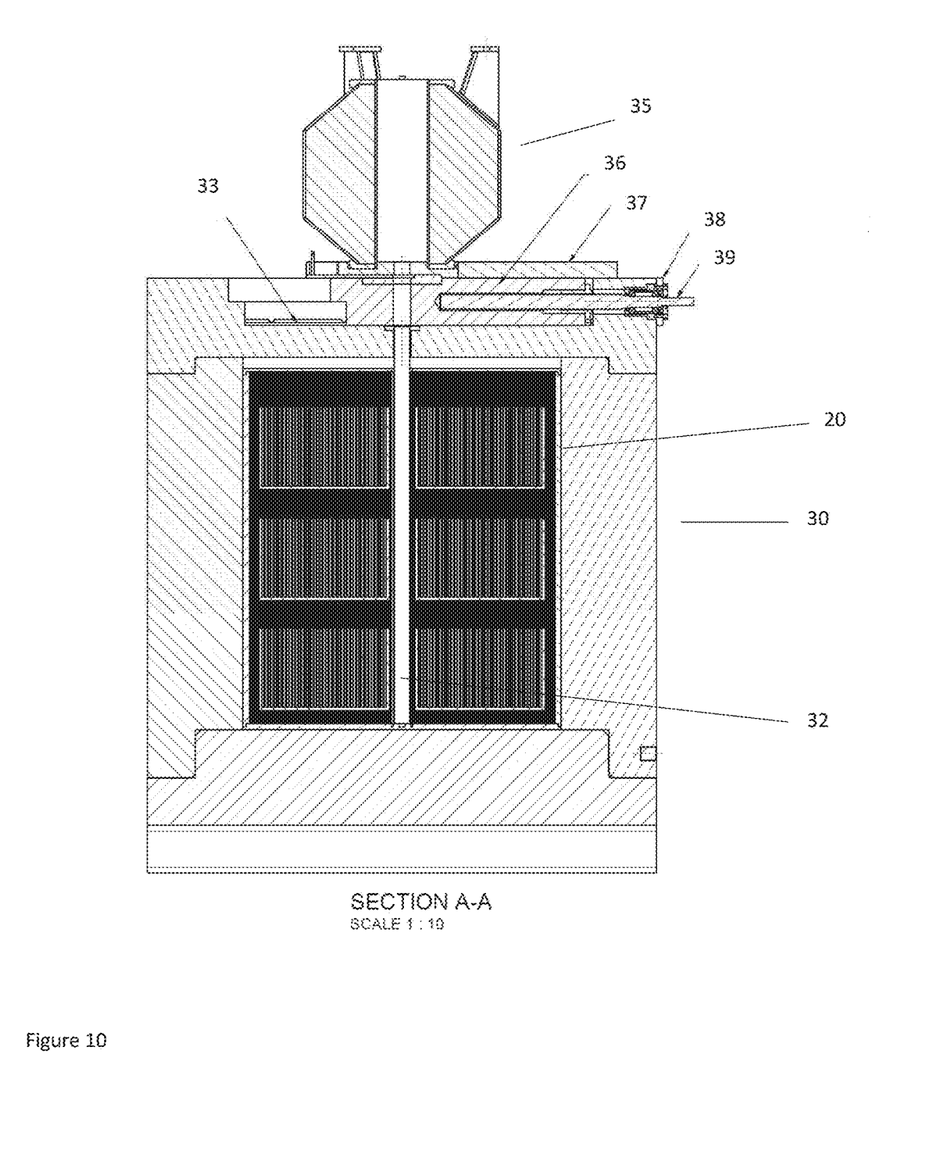

It will be appreciated that while a thin shielding or containment is required for a pure beta emitting isotope, for gamma and x-ray radiation a more substantial structure is required. The larger power generation system shown in FIGS. 9 and 10 incorporates appropriate shielding for use of the system as a standalone power generating unit. The shielding requires an appropriate selection and thickness of a high density material, such as depleted uranium, tungsten, lead, steel or iron, or lower density material with appropriate thickness/breadth such as concrete or water. The power generation unit 30 illustrated in FIG. 9 incorporates 300 mm of steel/iron containment around a central 1 m$^3$ walled cavity. As described above, the cavity holds multiple cartridges 10, and three radioisotope load channels. As shown in FIG. 10, the power generation unit 30 also has gate track 33, gamma gate 36, cover plate 37, bearing cartridge 38 and ball screw 39.

Alternative implementations may use different shielding materials, with corresponding changes to the dimensions and structure. For example, in the embodiment of FIG. 9, the steel/iron containment could be replaced with w 1.5 m thick concrete outer casing, or water with a head height of 4 m to 5 m. A further embodiment of FIG. 9 removes the containment from around the inner 1 cubic meter walled cavity and incorporates the containment into a separate structure or building (wall), the preferred material of structure being 1.5 m thick concrete.

The materials in the example described above have exhibited radiation hardness up to 15 mega Rad (150,000 Grey).

Implementations of the present invention provide an electrical generation system employing an n-type semiconductor material having metal electrodes in contact with a sandwich of semiconductor material, and exposing the arrangement to radiation from a radionuclide material. The radioactive emissions are converted into electrical energy at the metal-semiconductor junctions formed between the electrodes and the n-type and p-type semiconductor material. For flow of generated electrical energy, it is important that there is a potential difference between the electrodes. Hence, there needs to be a significant difference in metal to semiconductor contact area between the electrodes in order that greater charge generation is created at one electrode compared with the other. The electrode having greater charge accumulation effectively becomes the negative terminal and the other electrode becomes the positive terminal.

To maximise electrical generation in a radioisotope power cell, it is desirable to use a relatively high energy level radiation source and a high activity density. However, most semiconductor materials cannot withstand such high energy levels and structurally degrade with exposure.

In practical experiments, a thin film of zinc oxide was formed on a substrate, by reactive DC magnetron sputter or electrochemical vapour deposition, the deposited film having a surface ranging from 5 cm×5 cm to 250 cm×250 cm. Current deposition technology enables larger panels, for example above 1 m².

The substrate consisted of a first layer of glass. The substrate further consisted of a layer of a doped metal oxide material, which formed the surface upon which the zinc oxide was deposited. The metal oxide being either intrinsically p-type or n-type, whereby, the use of appropriate doping provided either an n-type or p-type semiconductor material adjacent to each planar face of the zinc oxide thin film.

A number of metal materials and metal alloys were tested for suitability as electrodes, namely aluminium, cobalt, cobalt-copper, cobalt-nickel, cobalt-platinum, cobalt-titanium, copper, copper chromium, nickel, nickel-cobalt, nickel-copper, nickel-chromium, nickel-platinum, nickel-vanadium and zinc. In addition, different electrode configurations were examined, a first whereby the electrode covered an entire surface of the zinc oxide layer and a second whereby a comb-like or finger-like grid formation was used on the zinc oxide surface. The general thickness of the metal electrode material was in the range of 100-1000 nm, and preferably 250 nm. The metal electrode in this example was deposited using sputtering techniques.

Testing results found that aluminium, cobalt, cobalt-copper, cobalt-nickel, cobalt-platinum, cobalt-titanium, copper, copper chromium, nickel, nickel-cobalt, nickel-copper, nickel-chromium, nickel-platinum, nickel-vanadium and zinc all produced linear and symmetric current-voltage curves at the metal-semiconductor junction suggesting a desirable degree of ohmic contact between these metals and the respective n-type or p-type semiconductor material.

In respect of the different configurations, a negligible difference in results was noted. This suggests that the comb-like grid configuration, which uses less metal, is a viable option. It will be appreciated that other geometries and configurations are contemplated within the scope of the present invention.

Although any suitable isotope could be used, at present the preferred materials are sealed sources containing cobalt-60, caesium-137 or europium-152. There exist many different forms and shapes of sealed source for these materials, e.g. rods, pencils, or pucks. While in principle the present invention could be implemented using any shape of source, the preferred source form for use in the structure of FIG. 9 is a rod or pencil. Our preferred single source activity has a maximum activity of 15000 Curie, with 10000 Curie being a more transportable and easier to handle activity.

Practical examples of power supply devices employing the electrical generator system will now be described. It will be appreciated that the components in practical systems may have many different dimensions, have single or multiple layers, of be formed as cartridges as described above of 50 or more layers. Substrates (sandwiches) may have any suitable area, for example from 75 sq cm, through to 62500 sq cm have been found suitable.

It will be appreciated that structures with more than one layer of radionuclide may be used, with multiple sandwich structures added to provide a desired power level. It will also be understood that although the structure described is generally square in shape, the structure could be of any desired shape, and could be curved in a suitable implementation, assuming appropriate spacings can be maintained.

A test was conducted to assess the power performance and radiation exposure stability of examples of systems according to the present invention. The structure for this test was a wafer of 100 mm diameter, providing a surface area of about 75 cm². The structure used 250 μm metal electrodes, 1.0 μm doped metal oxides (n-type and p-type) and 0.5 μm ZnO. Two separate arrays identified as Co7 and Co9 were tested in various configurations, including separately, as well as connected together in series and in parallel.

In one experiment, Co7 and Co9 were connected and exposed to a Cobalt-60 source for 36 hours, receiving a dose rate of approximately 15.12 MegaGray (MGy) of gamma radiation during the performance test period. The Cobalt-60 source used, emitted an average gamma dose into the test chamber of 70 Gray (Gy) per minute (average 420000 Rad per hour), or 1.2×10¹³ photons per second—each photon having an average energy of >1.1 MeV.

Figure 3:
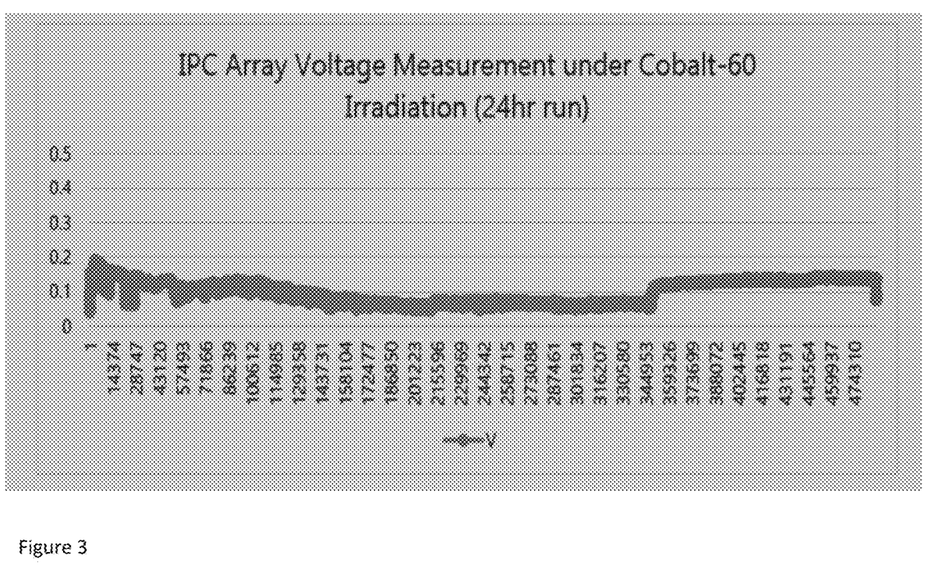
FIG. 3 is a graph showing the voltage performance in a first test example.

The electrical performance of the devices appeared relatively stable and unchanged during this testing period, with a pre-radiation and post radiation internal voltage of around 20 mV, and an average produced voltage under radiation, $V_{IRR}$ of approximately 100 mV. FIG. 3 shows the voltage performance in the first test example.

Measured average Current, $I_{IRR}$ was 354 mA
Measured average Voltage, $V_{IRR}$ was 100 mV
Average Power, $P_{IRR}$ produced was 35.4 mW
Max theoretical power output, $P_{Max}$, calculated as 3.304 W Conversion Efficiency=$P_{IRR}/P_{Max}$=35.4/3304=1.07%

Exposure to such a high gamma field for a period of sustained time would typically irrevocably damage semiconductor materials. However, in this trial the devices demonstrated 'radiation hardness' at 150 kGy (15 MRad). The electrical output was substantially unchanged during and after exposure.

Reference: *Radiation Hardness Test for Gamma Probe*; U. Wengrowicz, R. Seif, J. Nir, E. Gonen and D. Tirosh; Nuclear Research Center—Negev, P.O. Box 9001, Beer Sheva 84190, Israel In a separate trial, the Co7 and Co9 devices were irradiated by x-rays of photon energy/photon flux, 100 kV/4.5 mA, 100 kV9 mA and 200 kV/4.5 mA, at an approximate distance of 10 cm.

Figure 4:
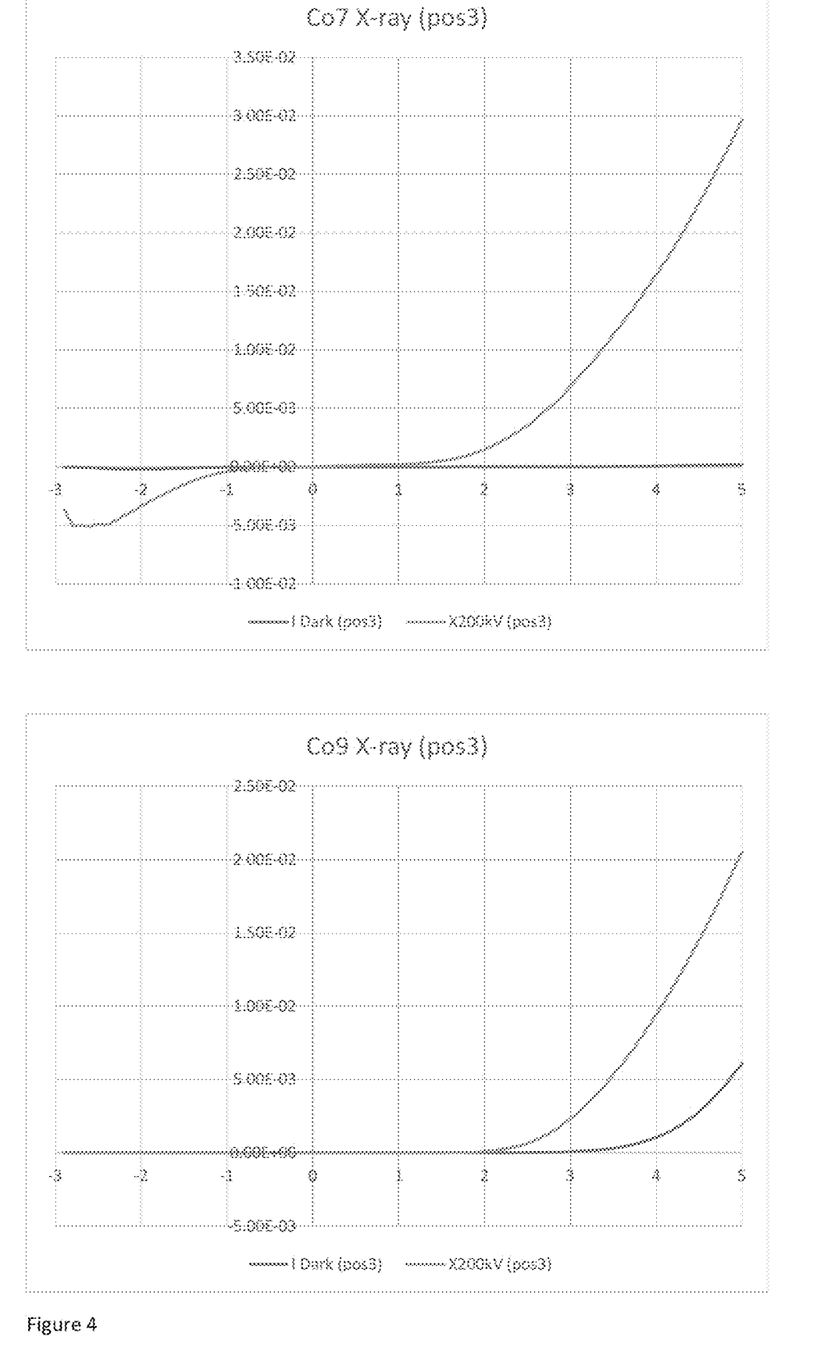
FIG. 4 are graphs illustrating current generated in a second test example.

FIG. 4 shows the IV graphs for Co7 and Co9 both in 'dark' and irradiated by x ray (200 kV/4.5 mA) where the x-ray radiation impinging on the wafer is 3.446 mJ·s⁻¹: Both semiconductor wafers demonstrated a strong response to the x-ray photons. Co7 displayed negligible leakage current in both forward and reverse bias. Co9 showed leakage current under dark conditions above +3 v. At 5 v, Co7 generated approximately 30 mA of current. At 5 v, Co9 generated approximately 15 mA current.

It was observed across multiple individual semiconductor wafers, that at a distance of 5 cm, doubling the voltage from 100 kV to 200 kV, resulted in twice the voltage and 1.9 times the current produced by the semiconductor. As such, doubling the photon voltage resulted in a 3.8-fold increase in power. This increase is slightly lower than the calculated difference at approximately 4.1-fold.

It was observed across multiple individual semiconductor wafers, that at a distance of 5 cm, doubling the current from 4.5 mA to 9 mA, resulted in 1.2 times the voltage and a current value 1.5 times the current produced by the semiconductor. As such, doubling the photon flux resulted in a 1.8-fold increase in power. This increase is slightly lower than the calculated difference at approximately 2-fold.

It was observed that adding more semiconductor layers increased the power output, such that a higher voltage and current were achieve, which was greater than the sum of the individual cell performance tests.

Configuring the layers in series and parallel aids to stabilise the output current and voltage of the semiconductor array.

In another separate trial, the Co7 and Co9 devices were irradiated with gamma photons from Cobalt-60, the activity of the radioisotope being ~535 TBq, and the measured dose rate being 76.3 Gy/min. The distance from radioisotope to the semiconductor wafers was measured and estimated at 10 cm. Gamma radiation impinging on the array is $1.83 \times 10^{-1}$ J·s$^{-1}$.

Figure 5:
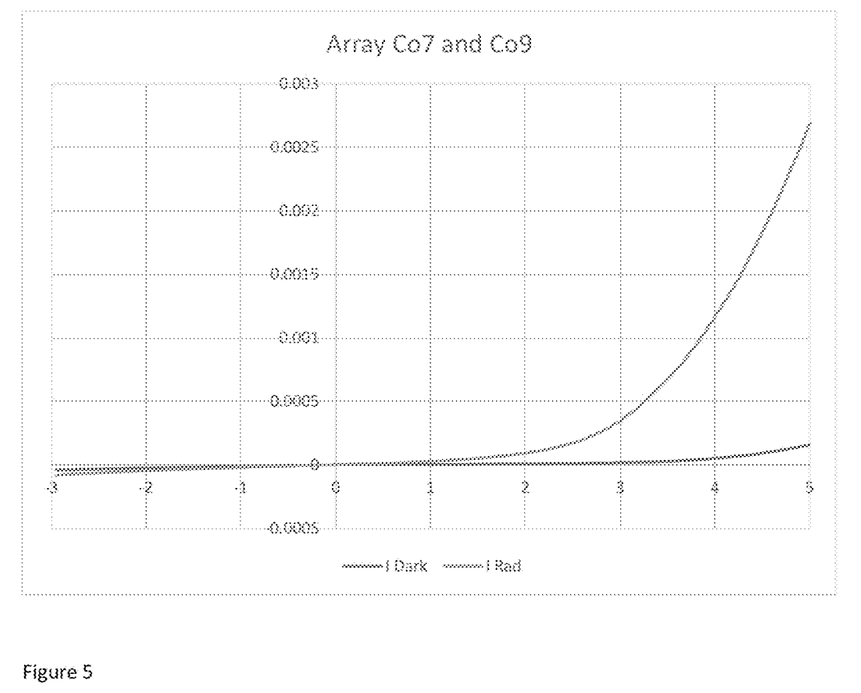
FIG. 5 is a graph illustrating current generated in a third test example.

FIG. 5 shows a graph for a parallel array consisting of Co7 and Co9 both in 'dark' and irradiated by gamma photons. As shown in the graph, the parallel array demonstrated a strong response to x-ray photons. The array displayed negligible leakage current. At 5 v, the array generated approximately 2.5 mA current.

It was observed that adding more semiconductor layers increased the overall power output. It was also observed that configuring the layers in series and parallel aids to stabilise the output current and voltage of the semiconductor array.

The invention claimed is:

1. An electrical generator system including:
   a radionuclide material; and a sandwich structure, the sandwich structure including:
   a layer of an n-type semiconductor material;
   a layer of intrinsic n-type semiconductor material;
   a layer of p-type semiconductor material; and
   metal electrodes, one of the electrodes being in direct contact with said n-type semiconductor material and another electrode being in contact with the p-type semiconductor material, forming metal-semiconductor junctions therebetween; wherein radiation emissions received from said radionuclide material are converted into electrical energy at said metal-semiconductor junctions; and
   electrical contacts connected to said electrodes which facilitate the flow of said electrical energy when connected to a load.

2. A system according to claim 1, wherein the system includes multiple repetitions of said sandwich structure, so that the radiation emissions from the radionuclide material pass through said multiple repetitions of the metal-semiconductor junctions.

3. The electrical generator system of claim 1, wherein the intrinsic n-type semiconductor material is zinc oxide.

4. The electrical generator system of claim 1, wherein the n-type material is aluminium zinc oxide.

5. The electrical generator system according to claim 4, wherein the aluminum zinc oxide has an atomic ratio of 98 Zn to 2 Al.

6. The electrical generator system according to claim 2, wherein 10 or more repetitions of the sandwich structure are arranged in a unit, and multiple such units are arranged within a shielded cavity, the cavity also including one or more sections of radioactive material.

7. The electrical generator system according to claim 1, wherein the sandwich is formed on a substrate.

8. The electrical generator system according to claim 1, wherein the thin layer of zinc oxide has a thickness between 150-1500 nm.

9. An electrical power supply device including a housing enclosing an electrical generator system according to claim 1.

10. The electrical generator system of claim 2, wherein the intrinsic n-type semiconductor material is zinc oxide.

11. The electrical generator system of claim 2, wherein the n-type material is aluminium zinc oxide.

12. The electrical generator system of claim 3, wherein the n-type material is aluminium zinc oxide.

13. The electrical generator system according to claim 2, wherein the sandwich is formed on a substrate.

14. The electrical generator system according to claim 3, wherein the sandwich is formed on a substrate.

15. The electrical generator system according to claim 2, wherein the thin layer of zinc oxide has a thickness between 150-1500 nm.

16. The electrical generator system according to claim 3, wherein the thin layer of zinc oxide has a thickness between 150-1500 nm.

17. An electrical power supply device including a housing enclosing an electrical generator system according to claim 2.

18. An electrical power supply device including a housing enclosing an electrical generator system according to claim 3.

* * * * *